United States Patent
Huang

(10) Patent No.: US 11,199,603 B2
(45) Date of Patent: Dec. 14, 2021

(54) MAGNETC RESONANCE IMAGING

(71) Applicant: Neusoft Medical Systems Co., Ltd., Liaoning (CN)

(72) Inventor: Feng Huang, Shanghai (CN)

(73) Assignee: Neusoft Medical Systems Co., Ltd., Liaoning (CN)

(*) Notice: Subject to any disclaimer, the term of this patent is extended or adjusted under 35 U.S.C. 154(b) by 132 days.

(21) Appl. No.: 16/572,212

(22) Filed: Sep. 16, 2019

(65) Prior Publication Data

US 2020/0096587 A1    Mar. 26, 2020

(30) Foreign Application Priority Data

Sep. 20, 2018 (CN) .......................... 201811117628.4

(51) Int. Cl.
  *G01R 33/561* (2006.01)
  *G01R 33/56* (2006.01)
  *G01R 33/565* (2006.01)

(52) U.S. Cl.
  CPC ...... *G01R 33/5611* (2013.01); *G01R 33/5608* (2013.01); *G01R 33/56545* (2013.01)

(58) Field of Classification Search
  CPC ............ G01R 33/5611; G01R 33/5608; G01R 33/56545; G01R 33/56; A61B 5/055
  See application file for complete search history.

(56) References Cited

U.S. PATENT DOCUMENTS

| 10,921,405 | B2* | 2/2021 | Nagashima | .......... G01R 33/385 |
| 2005/0189942 | A1 | 9/2005 | Tsao et al. | |
| 2009/0161932 | A1 | 6/2009 | Chen | |
| 2013/0310678 | A1 | 11/2013 | Balbi et al. | |

FOREIGN PATENT DOCUMENTS

| CN | 102928796 | 2/2013 |
| CN | 103091656 | 5/2013 |
| CN | 103477238 | 12/2013 |
| CN | 107576924 | 1/2018 |

OTHER PUBLICATIONS

Huang, Feng, et al., "Partial Fourier Reconstruction Through Data Fitting and Convolution in k-Space," Magnetic Resonance in Medicine 62.5(2009):1261-1269.

(Continued)

*Primary Examiner* — Susan S Lee
(74) *Attorney, Agent, or Firm* — Fish & Richardson P.C.

(57) ABSTRACT

Methods, devices, systems and apparatus for determining emphysema thresholds for controlling magnetic resonance imaging are provided. In one aspect, a magnetic resonance imaging method includes: collecting magnetic resonance imaging data as first k-space data by undersampling a magnetic resonance signal, performing parallel imaging reconstruction on the first k-space data to obtain a first image, performing enhancement processing on the first image to obtain a second image that comprises distributional information of image supporting points, and performing constrained reconstruction on the first k-space data by using the second image as a prior image to obtain a third image as a magnetic resonance image to be displayed.

20 Claims, 3 Drawing Sheets

(56) References Cited

OTHER PUBLICATIONS

Pruessmann, Klaas P., et al., "SENSE: Sensitivity Encoding for fast MRI," Magnetic Resonance in Medicine, 42(1999):952-962.
Huang, Feng, et al., "A Rapid and Robust Numerical Algorithm for Sensitivity Encoding with Sparsity Constraints: Self-Feeding Sparse SENSE," Magnetic Resonance in Medicine 64:1078-1088 (2010).
Chen et al., "Regularized Parallel MRI Using Conjugate Gradient Iterations," Computer Measurement & Control, Dec. 31, 2015, 23(12), 3 pages (with English Abstract).
Liang et al., "*K-t* ISD: Dynamic Cardiac MR Imaging Using Compressed Sensing with Iterative Support Detection," Magnetic Resonance in Medicine, Nov. 23, 2012, 68(1), 13 pages.
Office Action and Search Report in Chinese Appln. No. 201811117628.4, dated Jul. 29, 2021, 17 pages (with English Translation).
Xiao et al., "Regularized SPACE-RIP parallel magnetic resonance imaging reconstruction method," Journal of Tsinghua University (Science and Technology), Dec. 31, 2007, 47(9), 4 pages (with English Abstract).
Xie et al., "Robust EPI Nyquist Ghost Removal by Incorporating Phase Error Correction With Sensitivity Encoding (PEC-SENSE)," Magnetic Resonance in Medicine, Jun. 7, 2017, 79(2), 9 pages.

\* cited by examiner

MAGNETC RESONANCE IMAGING

CROSS REFERENCE TO RELATED APPLICATIONS

This application claims priority to Chinese Patent Application No. 201811117628.4 filed on Sep. 20, 2018, the entire content of which is incorporated herein by reference.

TECHNICAL FIELD

The present disclosure relates to the field of medical imaging technology, and in particular, to a magnetic resonance imaging method and a device for controlling magnetic resonance imaging.

BACKGROUND

Magnetic Resonance Imaging (MRI) has high soft tissue contrast and spatial resolution. By using MRI, morphological and functional information of an examination region can be obtained, and parameters and slices for imaging can be flexibly selected according to needs. MRI has become an important means of medical imaging examination.

SUMMARY

The present disclosure provides methods, devices, systems and apparatus for magnetic resonance imaging. In general, one innovative aspect of the subject matter described in this specification can be embodied in methods that include the actions of magnetic resonance imaging, including: collecting magnetic resonance imaging data as first k-space data by undersampling a magnetic resonance signal; performing parallel imaging reconstruction on the first k-space data to obtain a first image; performing enhancement processing on the first image to obtain a second image, where the second image includes distributional information of image supporting points; and performing constrained reconstruction on the first k-space data by using the second image as a prior image to obtain a third image, where the third image is a magnetic resonance image to be displayed.

Other embodiments of this aspect include corresponding computer systems, apparatus, and computer programs recorded on one or more computer storage devices, each configured to perform the actions of the methods. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. For example, performing parallel imaging reconstruction on the first k-space data to obtain the first image can includes: performing parallel imaging reconstruction on the first k-space data by using a Sensitivity Encoding (SENSE) algorithm to obtain the first image.

In some implementations, performing constrained reconstruction on the first k-space data by using the second image as a prior image to obtain the third image includes: performing constrained reconstruction on the first k-space data with a SENSE algorithm based on coil sensitivity by using the second image as the prior image to obtain the third image.

In some examples, performing constrained reconstruction on the first k-space data with a SENSE algorithm based on coil sensitivity by using the second image as the prior image to obtain the third image includes: determining a to-be-determined value of each image point in the third image according to a formula; and filling an image domain with the values of the image points in the third image to generate the third image. The formula can be as follows:

$$I^* = \operatorname*{argmin}_{I}\left( \|S_{\gamma,\rho}I - a\|^2 + \alpha \frac{\|I\|^2}{\|t^*\|^{\lambda_2}} \right),$$

where $I^*$ represents a to-be-determined value of an image point in the third image;

$S_{\gamma,\rho}$ represents a coil sensitivity matrix of an aliased point corresponding to the to-be-determined image point, where the coil sensitivity matrix has $\gamma$ rows and $\rho$ columns, $\gamma$ represents a number of channels, and $\rho$ represents an aliased factor;

I represents a vector of image points in the third image corresponding to the aliased point, where a dimension of the vector of the image points in the third image corresponding to the aliased point equals the aliased factor;

a represents a vector of the aliased point in an aliased image generated by performing Fourier transform on the first k-space data, where the dimension of the vector of the aliased point in the aliased image equals the number of channels $\gamma$;

$t^*$ represents a value of an image point in the second image corresponding to the image point in the third image; and each of $\alpha$ and $\lambda_2$ represents a respective non-negative parameter.

In some examples, the method further includes: determining the aliased point corresponding to the image points in the third image based on an acceleration factor of the undersampling of the magnetic resonance signal and a location of the image point in the third image.

In some implementations, the method further includes: determining whether a condition for stopping iterations is fulfilled; and in response to a determination that the condition for stopping the iterations is not fulfilled, taking the third image as a new first image, performing enhancement processing on the new first image to obtain a new second image, and performing constrained reconstruction on the first k-space data by using the new second image as a prior image to obtain a new third image. The condition for stopping the iterations includes at least one of: an iteration number reaching a preset iteration number threshold, or a quality of the new third image reaching a preset requirement.

Moduli of the image supporting points in the second image can be larger than values of background noises in the second image.

Performing parallel imaging reconstruction on the first k-space data to obtain the first image can include: performing parallel imaging reconstruction on the first k-space data using Generalized Autocalibrating Partially Parallel Acquisitions (GRAPPA) method to obtain the first image.

In some implementations, performing enhancement processing on the first image includes: performing enhancement processing on the first image by using a total variation model. Performing enhancement processing can include: determining a value of each image point in the second image according to a formula; and filling an image domain with the values of the image points in the second image to generate the second image. The formula can be as follows:

$$I^* = \underset{t}{\operatorname{argmin}}\left(\|t - u^*\|^2 + \lambda_1 \|\nabla t\|_1\right)$$

t* represents a to-be-determined value of an image point in the second image;

t represents a to-be-determined variable;

∇t represents a partial derivative of the to-be-determined variable;

u* represents a value of an image point in the first image corresponding to the to-be-determined image point; and $\lambda_1$ represents a non-negative parameter.

Undersampling a magnetic resonance signal can include: increasing a sampling speed at an acceleration factor by reducing a sample rate of the magnetic resonance signal according to a sampling trajectory. The sampling trajectory can include one of equidistant undersampling, random undersampling, and variable density undersampling.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

The clinical application of magnetic resonance imaging (MRI) can be affected by factors such as imaging speed, signal-to-noise ratio, and artifacts. To increase the speed of magnetic resonance imaging, partial sampling technologies, such as parallel imaging and half Fourier imaging, are widely applied in magnetic resonance imaging. However, by making the speed of magnetic resonance scanning faster, the partial sampling technologies may lead to a reduction in signal-to-noise ratio and an increase in the number of artifacts for a reconstructed image.

In some examples, in the compressed sensing technology, normalization is performed with image sparseness in a certain mathematical domain, to achieve a relatively good reconstruction result, thereby effectively avoiding the impact of partial sampling technologies on image quality. However, the compressed sensing technology may require iterative reconstruction when reconstructing, which makes the reconstruction time relatively long.

In some examples, the Self-Feeding Sparse SENSE (SFSS) algorithm provides a fast convergence method that can solve the problem of long reconstruction time. However, to better preserve detail information in an image, the SFSS algorithm cannot completely eliminate noises in the image.

Implementations of the present disclosure provide a magnetic resonance imaging method, which can address the above issues or problems. The method can include: collecting magnetic resonance imaging data as first k-space data by using an undersampling manner, performing parallel imaging reconstruction on the first k-space data to obtain a first image, performing enhancement processing on the first image to obtain a second image that includes distributional information of image supporting points, and performing constrained reconstruction on the first k-space data by using the second image as a prior image to obtain a third image, where the third image is a magnetic resonance image to be displayed.

In the magnetic resonance imaging method provided by examples of the present disclosure, by taking the second image including the distributional information of the image supporting points as the prior image, constrained reconstruction is performed on the first k-space data collected by the undersampling manner, so as to obtain a magnetic resonance image to be displayed. Since the prior image can have a high quality, the third image obtained through constrained reconstruction can also have high quality with low image noise and few artifacts. Moreover, in the magnetic resonance imaging method, the image of high quality is obtained without the use of iterative reconstruction, thereby allowing the magnetic resonance imaging method to be performed with a fast imaging speed.

Figure 1:
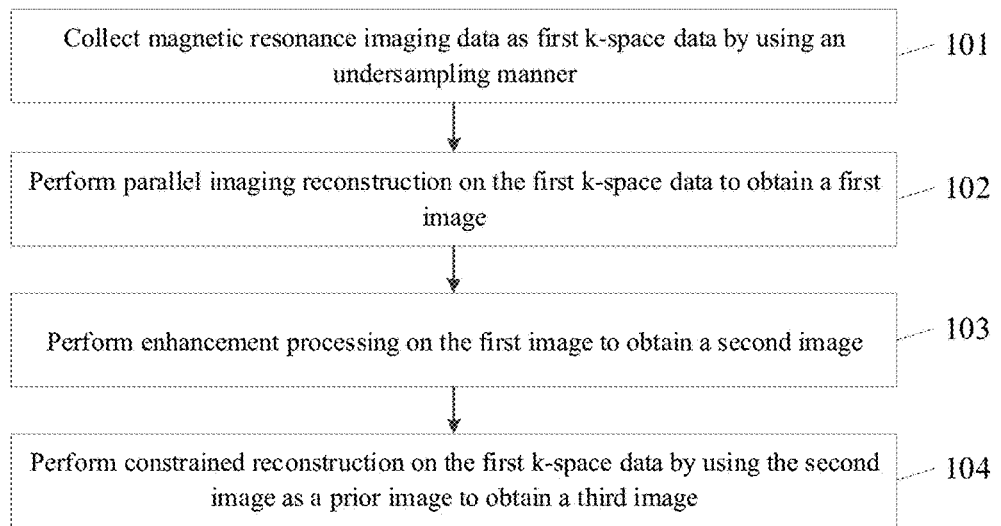
FIG. 1 is a flowchart of a process of a magnetic resonance imaging method according to one or more examples of the present disclosure.

FIG. 1 is a flowchart of a process of a magnetic resonance imaging method according to one or more examples of the present disclosure. As shown in FIG. 1, the process can include steps 101-104.

At step 101, magnetic resonance imaging data as first k-space data is collected by using an undersampling manner.

The undersampling manner can increase a sampling speed by reducing a sampling rate of a magnetic resonance signal. In one or more examples of the present disclosure, a sampling trajectory of the undersampling manner can include at least one of: equidistant undersampling, random undersampling, or variable density undersampling.

As an example, the step 101 may be specifically: collecting magnetic resonance imaging data as the first k-space data by using an undersampling manner in which the sampling trajectory is equidistant undersampling.

At step 102, parallel imaging reconstruction is performed on the first k-space data to obtain a first image.

During parallel imaging, multiple receiving coils of known location and sensitivity are used to assist in locating a spatial position of the magnetic resonance signal.

In one or more examples of the present disclosure, the parallel imaging reconstruction algorithm includes one of Sensitivity Encoding (SENSE) or Generalized Autocalibrating Partially Parallel Acquisitions (GRAPPA).

As an example, to increase the speed of magnetic resonance imaging, the SENSE algorithm is used to perform parallel imaging reconstruction on the first k-space data to obtain the first image. When the SENSE algorithm is used to perform parallel imaging reconstruction on the first k-space data, step 102 can includes two steps.

At the first step, a value of each image point in the first image is determined according to formula (1).

The formula (1) can be specifically as follows:

$$u^* = \underset{u}{\operatorname{argmin}}\left(\|S_{\gamma,\rho}u - a\|^2\right); \qquad (1)$$

u* represents a to-be-determined value of an image point in the first image;

$S_{\gamma,\rho}$ represents a coil sensitivity matrix of an aliased point corresponding to the to-be-determined image point, where the coil sensitivity matrix is of γ rows and ρ columns, γ represents the number of channels, and ρ represents an aliased factor;

u represents a vector of image points in the first image corresponding to the aliased point. A dimension of the vector of image points in the first image corresponding to the aliased point equals the aliased factor ρ;

a represents a vector of the aliased point in an aliased image generated by performing Fourier transform on the first k-space data. The dimension of the vector of the aliased point in the aliased image equals the number of channels γ; and $\|S_{\gamma,\rho}u-a\|^2$ represents a 2-norm of a matrix $S_{\gamma,\rho}u-a$.

The specific process of determining the value u* of each image point in the first image according to formula (1) is as follows. First, the correspondence between the aliased point and the image point is determined. For example, the correspondence between the aliased point and the image point in the image domain may be determined on the basis of the undersampling manner used in scanning. One aliased point corresponds to a plurality of image points, the number of which equals the aliased factor, where the aliased factor equals the acceleration factor. Then, the coil sensitivity matrix of the aliased point is obtained, where elements in the first row of the coil sensitivity matrix are associated with channel 1, elements in the second row are associated with channel 2, . . . , and so on. A product of the coil sensitivity matrix $S_{\gamma,\rho}$ of the aliased point and the vector u of image points corresponding to the aliased point is obtained. The vector of the aliased point in the aliased image generated by performing Fourier transform on the first k-space data is subtracted from the vector product $S_{\gamma,\rho}u$. The 2-norm of the matrix $S_{\gamma,\rho}u-a$ is obtained. The optimal image point value u* obtained through a least squares method is determined as the value of the image point.

The least squares method obtains an optimal value of a variable by minimizing the sum of squares of errors. Moreover, the sensitivity of the magnetic resonance imaging method to parameters of the magnetic resonance image is reduced by using the least squares method.

At the second step, an image domain is filled with the values of the image points of the first image to generate the first image.

The second step may be specifically: filling respective positions in the image domain with the values of the corresponding image points, thereby generating the first image.

As an example, when the number of image points is 100 and the number of positions in the first image is 100, the second step may specifically include: filling a first position in the first image with the value of the first image point, filling a second position in the first image with the value of the second image point, . . . , and so on, until filling a hundredth position in the first image with the value of the hundredth image point, thereby obtaining the first image.

At step 103, enhancement processing is performed on the first image to obtain a second image, where the second image includes distributional information of image supporting points.

Image enhancement refers to emphasizing purposefully either the overall or local characteristics of an image, making the original unclear image clear or highlighting certain features of interest, expanding the difference between features of different objects in the image, and/or suppressing features that are not of interest. In this way, the image quality can be improved, the amount of information can be enriched, the image can be better interpreted and recognized, and/or the denoising and anti-artifact effects can be further achieved.

An image supporting point is an image point where the modulus value greatly exceeds the background noise value or the low signal value. The value of an image point in the magnetic resonance image is a complex number, and the modulus value of an image point refers to the absolute value of the complex number. The image supporting points can be understood as image points in the image that plays a key role in the image quality, such as pixel points that determine the general outline of the image, rather than pixel points that reflect tissular detail information. Correspondingly, the distributional information of image supporting points is the distributional information of the general outline of the image. For example, for a blood vessel image, the distributional information of image supporting point is the distributional information of the general outline of the blood vessel, rather than the internal detail information of the blood vessel.

In some examples of the present disclosure, the image enhancement algorithm may be a total variation (TV) model or a deep neural network (DNN).

As an example, to preserve the tissular detail information, preserve the image boundary, and suppress the spot noise, the first image may be enhanced by using the total variation model to obtain the second image. The specific process includes two steps.

At the first step, the value of each image point in the second image is determined according to formula (2).

The formula (2) can be specifically as follows:

$$t^* = \underset{t}{\operatorname{argmin}}\left(\|t - u^*\|^2 + \lambda_1\|\nabla t\|_1\right); \qquad (2)$$

t* represents a to-be-determined value of an image point in the second image;

t represents a to-be-determined variable;

∇t represents a partial derivative of the to-be-determined variable;

u* represents a value of an image point in the first image corresponding to the image point in the second image; and $\lambda_1$ represents a non-negative parameter.

At the second step, an image domain is filled with the values of the image points in the second image to generate the second image.

At step 104, constrained reconstruction is performed on the first k-space data by using the second image as the prior image to obtain the third image, where the third image is a magnetic resonance image to be displayed.

The prior image refers to a reference image, which includes the distributional information of the image supporting points and is used for constrained reconstruction on the first k-space data. The constraint condition is: a signal in the prior image is low and a signal in the third image corresponding to the signal in the prior image is also low; and a signal in the prior image is high and a signal in the third image corresponding to the signal in the prior image is also high.

As an example, to improve the quality of the magnetic resonance image, the step 104 is specifically: performing constrained reconstruction on the first k-space data with a SENSE algorithm based on coil sensitivity by using the second image as the prior image to obtain the third image.

The specific process of constrained reconstruction on the first k-space data with the SENSE algorithm based on coil sensitivity can include three steps.

At the first step, a value of each image point in the third image is determined according to formula (3);

The formula (3) is specifically as follows:

$$I^* = \underset{I}{\arg\min}\left(\|S_{\gamma,\rho}I - a\|^2 + \alpha\frac{\|I\|^2}{\|t^*\|^{\lambda_2}}\right) \quad (3)$$

I* represents a to-be-determined value of an image point in the third image;

$S_{\gamma,\rho}$ represents a coil sensitivity matrix of an aliased point corresponding to the image point in the third image, where the coil sensitivity matrix is of γ rows and ρ columns, γ represents the number of channels, and ρ represents an aliased factor;

I represents a vector of image points in the third image corresponding to the aliased point, where a dimension of the vector of the image points in the third image corresponding to the aliased point equals the aliased factor;

a represents a vector of the aliased point in an aliased image generated by performing Fourier transform on the first k-space data, where the dimension of the vector of the aliased point in the aliased image equals the number of channels γ;

t* represents a value of an image point in the second image corresponding to the image point in the third image; and α and $\lambda_2$ respectively represent a non-negative parameter.

It is noted that in the first step, by using the least squares method to determine the value of each image point in the third image, the sensitivity of the magnetic resonance imaging method to the parameters of the magnetic resonance image is further reduced.

At the second step, an image domain is filled with the values of the image points in the third image to generate the third image;

At the third step, the third image is output as the magnetic resonance image to be displayed.

The above is the magnetic resonance imaging method provided by examples of the present disclosure. In the method, the second image including the distributional information of the image supporting points is used as the prior image, and the first k-space data obtained by undersampling is constrainedly reconstructed, to obtain a magnetic resonance image to be displayed. Since the prior image is of high quality, the third image obtained through constrained reconstruction is of high quality, and has low image noise and few artifacts. Moreover, in the magnetic resonance imaging method, an image of high quality is obtained without the use of iterative reconstruction, thereby giving the magnetic resonance imaging method a fast imaging speed.

To verify the effectiveness of the above magnetic resonance imaging method, examples of the present disclosure also provide experimental results of comparative experiments between the above method and two existing algorithms: SENSE and SFSS.

Figure 2A:
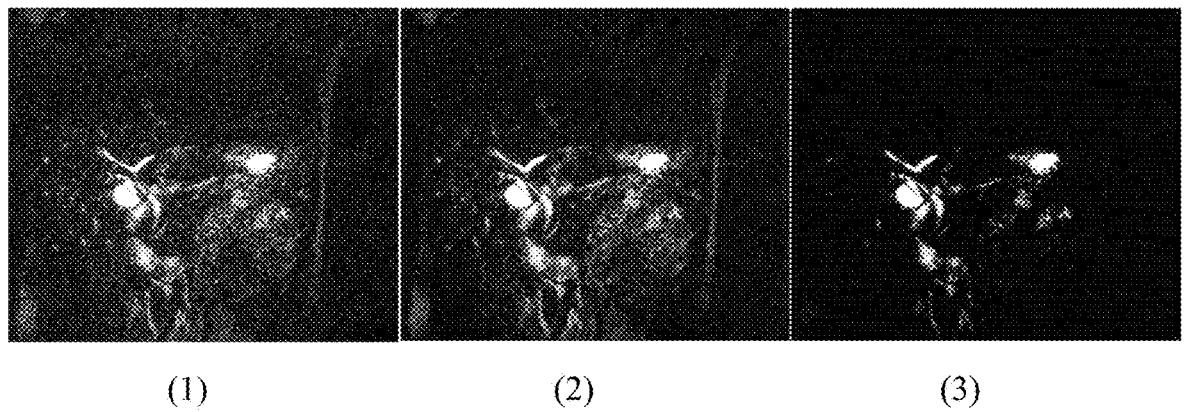
FIG. 2A is a schematic diagram of results of three algorithms using MRCP with an acceleration factor of 3.6 according to one or more examples of the present disclosure.

FIG. 2A is a schematic diagram of results of three algorithms using Magnetic Resonance Cholangiopancreatography (MRCP) with an acceleration factor of 3.6 according to one or more examples of the present disclosure.

In FIG. 2A, (1) is the result of SENSE, (2) is the result of SFSS, and (3) is the result of the magnetic resonance imaging method provided by examples of the present disclosure.

As can be seen from the images in FIG. 2A, the magnetic resonance imaging method provided by examples of the present disclosure sufficiently suppresses noise while ensuring the integrity of data.

Figure 2B:
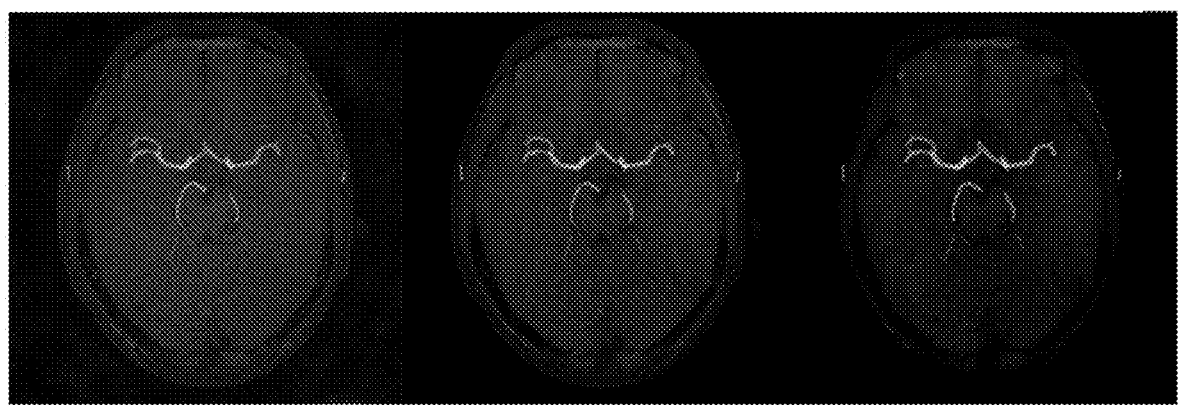
FIG. 2B is a schematic diagram of results of three algorithms using MRA with an acceleration factor of 2 according to one or more examples of the present disclosure.

FIG. 2B is a schematic diagram of results of three algorithms using Magnetic Resonance Angiography (MRA) with an acceleration factor of 2 according to one or more examples of the present disclosure.

In FIG. 2B, (1) is the result of SENSE, (2) is the result of SFSS, and (3) is the result of the magnetic resonance imaging method provided by examples of the present disclosure.

As can be seen from the images in FIG. 2B, the magnetic resonance imaging method provided by examples of the present disclosure sufficiently suppresses noise and improves contrast while ensuring the vascular detail.

It can be seen from the experimental data that the image obtained by the magnetic resonance imaging method provided by examples of the present disclosure is of high quality. In addition, since the magnetic resonance imaging method provided by examples of the present disclosure utilizes the least squares method twice, the magnetic resonance imaging method provided by examples of the present disclosure is insensitive to parameters.

It is noted that the magnetic resonance imaging method provided by examples of the present disclosure is applicable to various images, and in particular, to an image with a sparse image domain or an image with a sparse region in which the contrast is relatively strong.

To further improve the quality of the magnetic resonance image, the magnetic resonance imaging method provided in the above examples may be performed multiple times for iterative reconstruction. Specifically, the obtained third image may be used as the first image, and steps 103 to 104 may be executed cyclically to improve the image quality.

In addition, in the magnetic resonance imaging method provided by the examples of the present disclosure, a threshold of iteration number may be preset as the condition for stopping the iterations. The quality of the magnetic resonance image fulfilling a preset condition may also be used as the condition for stopping the iterations.

As an example, illustration will be described by taking a preset threshold of iteration numbers as the condition for stopping the iterations.

Figure 3:
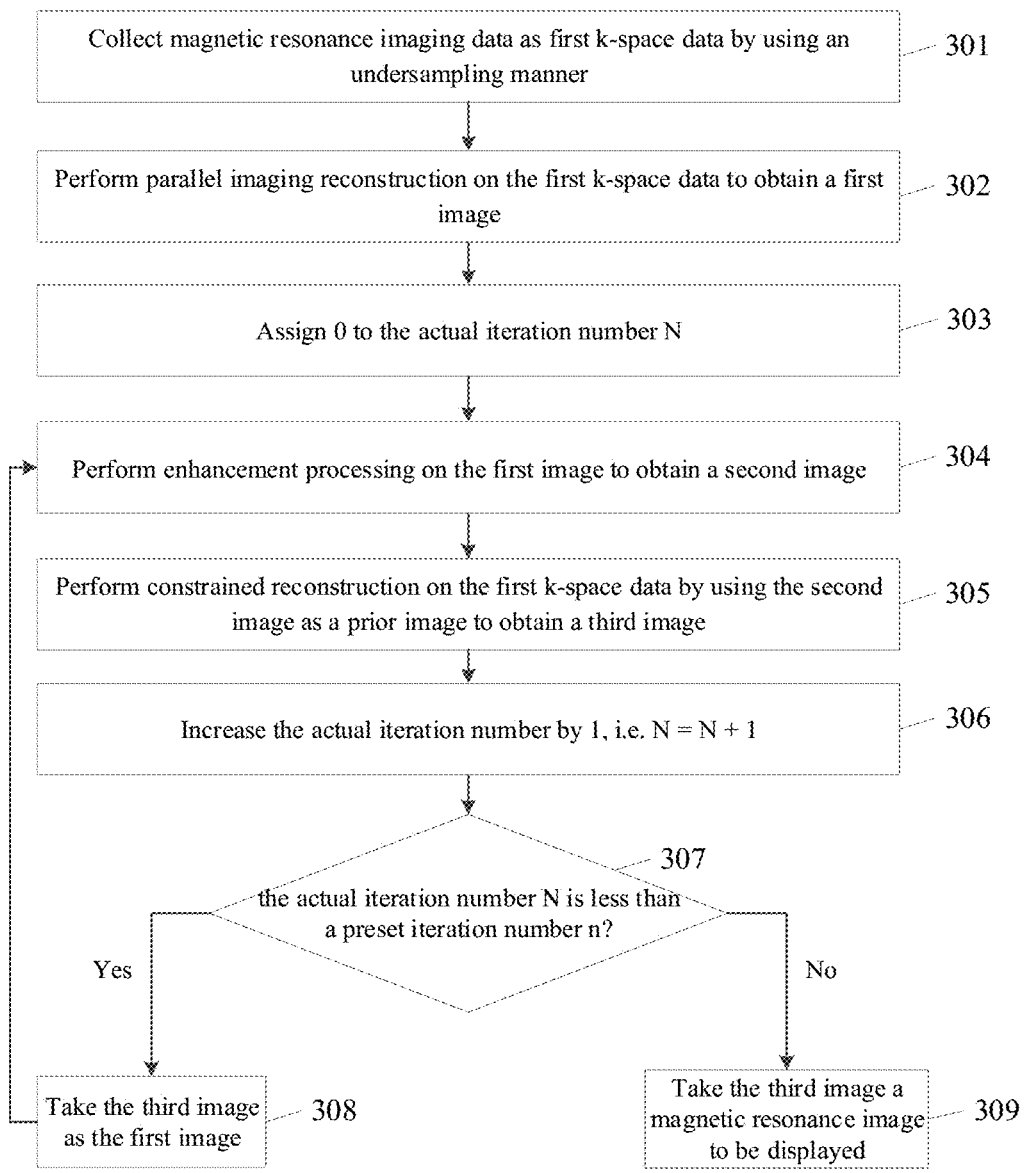
FIG. 3 is a flowchart of a process of a magnetic resonance imaging method according to one or more examples of the present disclosure.

FIG. 3 is a flowchart of a process of a magnetic resonance imaging method according to one or more examples of the present disclosure. As shown in FIG. 3, the magnetic resonance imaging method provided by examples of the present disclosure includes steps 301-309.

At step 301, magnetic resonance imaging data as first k-space data is collected by using an undersampling manner.

At step 302, parallel imaging reconstruction is performed on the first k-space data to obtain a first image.

At step 303, the actual iteration number N is assigned.

The actual iteration number N is a loop count variable. The actual iteration number N is initially assigned 0, which indicates that the loop is performed 0 times.

At step 304, enhancement processing is performed on the first image to obtain a second image, where the second image includes distributional information of image supporting points.

At step 305, constrained reconstruction is performed on the first k-space data by using the second image as a prior image to obtain a third image.

At step 306, the actual iteration number is increased by 1, i.e., N=N+1.

In this method, the loop body includes steps 304-305, and when the loop body runs once, the actual iteration number is increased by 1. N=N+1 indicates that the loop count variable N is increased by 1.

At step 307, it is determined whether the actual iteration number N is less than a preset iteration number n. If yes, step 308 is performed. If no, step 309 is performed.

The preset iteration number n is a threshold of the iteration number the loop body, which can be preset according to the actual scenario.

If the actual iteration number N is less than the preset iteration number n, then the loop body is not iterated enough and needs to be iterated more; and if the actual iteration number N is greater than or equal to the preset iteration number n, then the loop body is iterated enough and the iteration should be stopped.

At step 308, if the actual iteration number N is less than the preset iteration number n, the third image is taken as the first image, and the process jumps back to 304.

The third image is taken as the first image and again processed with the loop body including steps 304-305. In this way, the quality of the magnetic resonance image is further improved. Moreover, the quality of magnetic resonance imaging increases as the iteration number of the loop body increases.

At step 309, if the actual iteration number N is greater than or equal to the preset iteration number n, the third image is taken a magnetic resonance image to be displayed.

It is noted that, while improving the quality of the magnetic resonance image, multiple iterations of the loop body increases the time of the magnetic resonance imaging. Therefore, the preset iteration number n for the loop body is determined by taking into account both factors of imaging quality and imaging time. For example, the preset iteration number n may be determined as 2.

For convenience of description and a better understanding of the technical solutions provided by the present application for those skilled in the art, in the following description, the loop body being iterated twice will be taken as an example.

The magnetic resonance imaging method with a preset iteration number n=2 is specified as follows:

magnetic resonance imaging data as first k-space data is collected by an undersampling manner;

parallel imaging reconstruction is performed on the first k-space data obtain a first image;

an actual iteration number N is assigned 0;

enhancement processing is performed on the first image to obtain a second image, where the second image includes distributional information of the image supporting points;

constrained reconstruction is performed on the first k-space data by using the second image as a prior image to obtain a third image;

the actual iteration number N is assigned 1;

in response a determination that N (which equals 1) is less than the preset iteration number n (which equals 2), the third image is taken as a new first image;

enhancement processing is performed on the new first image to obtain a new second image, where the new second image includes distributional information of the image supporting points;

constrained reconstruction is performed on the first k-space data by using the new second image as a prior image to obtain a new third image;

the actual iteration number N is assigned 2; and in response to a determination that N (which equals 2) is equal to the preset iteration number n (which equals 2), the new third image is taken as the magnetic resonance image to be displayed.

In the magnetic resonance imaging method provided by examples of the present disclosure, the obtained third image is subject to repeated enhancement processing and constrained reconstruction. In this way, the quality of the magnetic resonance image is further improved.

Figure 4:
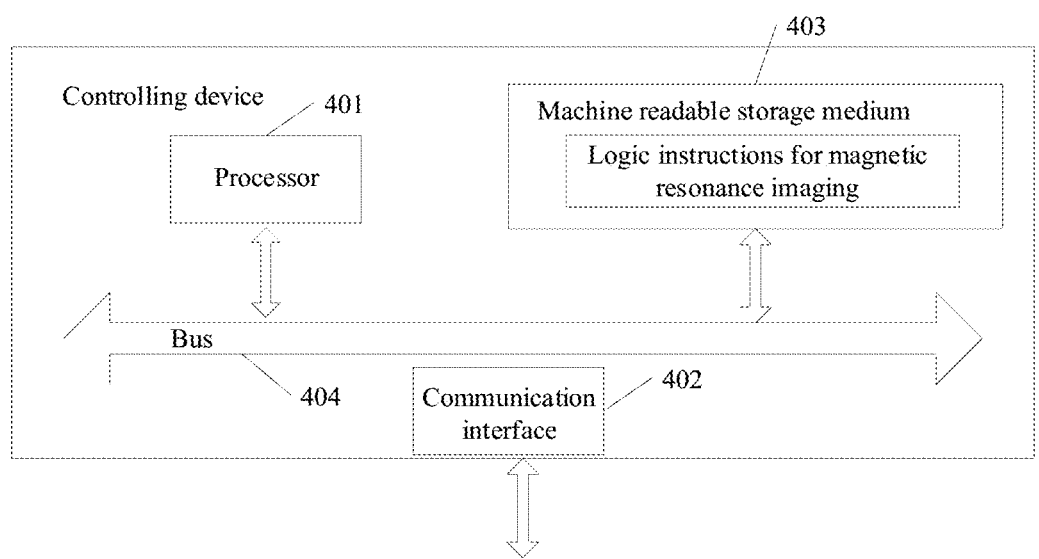
FIG. 4 is a schematic diagram of a structure of a controlling device according to one or more examples of the present disclosure.

FIG. 4 is a schematic diagram of a structure of a device for controlling magnetic resonance imaging according to one or more examples of the present disclosure.

The magnetic resonance imaging method provided by the above examples can be performed by the controlling device shown in FIG. 4. The controlling device shown in FIG. 4 includes a processor 401, a communication interface 402, a machine readable storage medium 403, and a bus 404. The processor 401, the communication interface 402, and the machine readable storage medium 403 intercommunicates through the bus 404.

The machine readable storage medium 403 stores logic instructions for magnetic resonance imaging, and the memory is, for example, a non-volatile memory. The processor 401 can invoke logic instructions for magnetic resonance imaging in the machine readable storage medium 403 to perform the magnetic resonance imaging method described above. As an example, the logic instructions for magnetic resonance imaging may be a program corresponding to a controlling software. When the processor executes the instructions, the controlling device may correspondingly display the function interface corresponding to the instructions on the display interface.

If implemented in the form of a function unit in a software and sold or used as an independent product, the logic instructions for magnetic resonance imaging may be stored in a computer readable storage medium. Based on such understanding, the essence or the part that contributes to the prior art of the technical solution of the present disclosure, may be embodied in the form of a software product stored in a storage medium, including instructions serving to make a computing device (which may be a personal computer, a server, or a network device, etc.) perform all or part of the steps of the method in the various examples of the present disclosure. The above-mentioned storage medium includes: a flash drive, a portable hard drive, a read-only memory (ROM), a random access memory (RAM), a magnetic disk, an optical disk, or any medium that can store program codes.

The above examples are only used to explain rather than to limit the technical solutions of the present disclosure; although the present disclosure has been described in detail with reference to the foregoing examples, those skilled in the art should understand that they can still modify the technical solutions described in the examples, or equivalently substitute some of the technical features thereof; such modifications and substitutions do not cause the essence of the corresponding technical solution to depart from the spirit and scope of the technical solutions in the examples of the present disclosure.

What is claimed is:

1. A magnetic resonance imaging method, comprising:
   collecting magnetic resonance imaging data as first k-space data by undersampling a magnetic resonance signal;
   performing parallel imaging reconstruction on the first k-space data to obtain a first image;
   performing enhancement processing on the first image to obtain a second image, wherein the second image comprises distributional information of image supporting points;
   performing constrained reconstruction on the first k-space data by using the second image as a prior image to obtain a third image, wherein the third image is a magnetic resonance image to be displayed; and
   displaying the third image.

2. The method according to claim 1, wherein performing parallel imaging reconstruction on the first k-space data to obtain the first image comprises:
   performing parallel imaging reconstruction on the first k-space data by using a Sensitivity Encoding (SENSE) algorithm to obtain the first image.

3. The method according to claim 1, wherein performing constrained reconstruction on the first k-space data by using the second image as a prior image to obtain the third image comprises:
   performing constrained reconstruction on the first k-space data with a SENSE algorithm based on coil sensitivity by using the second image as the prior image to obtain the third image.

4. The method according to claim 3, wherein performing constrained reconstruction on the first k-space data with a SENSE algorithm based on coil sensitivity by using the second image as the prior image to obtain the third image comprises:
   determining a to-be-determined value of each image point in the third image according to a formula; and
   filling an image domain with the values of the image points in the third image to generate the third image,
   wherein the formula is as follows:

$$I^* = \mathop{\text{argmin}}_{I}\left(\|S_{\gamma,\rho}I - a\|^2 + \alpha\frac{\|I\|^2}{\|t^*\|^{\lambda_2}}\right),$$

wherein $I^*$ represents a to-be-determined value of an image point in the third image;
   wherein $S_{\gamma,\rho}$ represents a coil sensitivity matrix of an aliased point corresponding to the to-be-determined image point, wherein the coil sensitivity matrix has $\gamma$ rows and $\rho$ columns, wherein $\gamma$ represents a number of channels, and $\rho$ represents an aliased factor;
   wherein I represents a vector of image points in the third image corresponding to the aliased point, wherein a dimension of the vector of the image points in the third image corresponding to the aliased point equals the aliased factor;
   wherein a represents a vector of the aliased point in an aliased image generated by performing Fourier transform on the first k-space data, wherein the dimension of the vector of the aliased point in the aliased image equals the number of channels $\gamma$;
   wherein $t^*$ represents a value of an image point in the second image corresponding to the image point in the third image; and
   wherein each of $\alpha$ and $\lambda_2$ represents a respective non-negative parameter.

5. The method according to claim 4, further comprising:
   determining the aliased point corresponding to the image points in the third image based on an acceleration factor of the undersampling of the magnetic resonance signal and a location of the image point in the third image.

6. The method according to claim 1, further comprising:
   determining whether a condition for stopping iterations is fulfilled; and
   in response to a determination that the condition for stopping the iterations is not fulfilled,
      taking the third image as a new first image,
      performing enhancement processing on the new first image to obtain a new second image, and
      performing constrained reconstruction on the first k-space data by using the new second image as a prior image to obtain a new third image,
   wherein the condition for stopping the iterations comprises at least one of:
      an iteration number reaching a preset iteration number threshold, or
      a quality of the new third image reaching a preset requirement.

7. The method according to claim 1, wherein moduli of the image supporting points in the second image are larger than values of background noises in the second image.

8. The method according to claim 1, wherein performing parallel imaging reconstruction on the first k-space data to obtain the first image comprises:
   performing parallel imaging reconstruction on the first k-space data using Generalized Autocalibrating Partially Parallel Acquisitions (GRAPPA) method to obtain the first image.

9. The method according to claim 1, wherein performing enhancement processing on the first image comprises:
   performing enhancement processing on the first image by using a total variation model, comprising:
      determining a value of each image point in the second image according to a formula; and
      filling an image domain with the values of the image points in the second image to generate the second image,
      wherein the formula is as follows:

$$t^* = \mathop{\text{argmin}}_{t}\left(\|t - u^*\|^2 + \lambda_1\|\nabla t\|_1\right)$$

wherein $t^*$ represents a to-be-determined value of an image point in the second image;
   wherein $t$ represents a to-be-determined variable;
   wherein $\nabla t$ represents a partial derivative of the to-be-determined variable;
   wherein $u^*$ represents a value of an image point in the first image corresponding to the to-be-determined image point; and
   wherein $\lambda_1$ represents a non-negative parameter.

10. The method according to claim 1, wherein undersampling a magnetic resonance signal comprises:
    increasing a sampling speed at an acceleration factor by reducing a sample rate of the magnetic resonance signal according to a sampling trajectory, wherein the sampling trajectory comprises one of equidistant undersampling, random undersampling, or variable density undersampling.

11. A device for controlling magnetic resonance imaging, comprising:
at least one processor; and
at least one non-transitory machine readable storage medium coupled to the at least one processor having machine-executable instructions stored thereon that, when executed by the at least one processor, cause the at least one processor to perform operations comprising:
collecting magnetic resonance imaging data as first k-space data by undersampling a magnetic resonance signal;
performing parallel imaging reconstruction on the first k-space data to obtain a first image;
performing enhancement processing on the first image to obtain a second image, wherein the second image comprises distributional information of image supporting points;
performing constrained reconstruction on the first k-space data by using the second image as a prior image to obtain a third image, wherein the third image is a magnetic resonance image to be displayed; and
displaying the third image.

12. The device according to claim 11, wherein performing parallel imaging reconstruction on the first k-space data to obtain the first image comprises:
performing parallel imaging reconstruction on the first k-space data by using a SENSE algorithm to obtain the first image.

13. The device according to claim 11, wherein performing constrained reconstruction on the first k-space data by using the second image as the prior image to obtain the third image comprises:
performing constrained reconstruction on the first k-space data with a SENSE algorithm based on coil sensitivity by using the second image as the prior image to obtain the third image.

14. The device according to claim 13, wherein performing constrained reconstruction on the first k-space data with a SENSE algorithm based on coil sensitivity by using the second image as the prior image to obtain the third image comprises:
determining a value of each image point in the third image according to a formula;
filling an image domain with the values of the image points in the third image to generate the third image,
wherein the formula is as follows:

$$I^* = \underset{I}{\mathrm{argmin}}\left(\|S_{\gamma,\rho}I - a\|^2 + \alpha\frac{\|I\|^2}{\|t^*\|^{\lambda_2}}\right),$$

wherein $I^*$ represents a to-be-determined value of an image point in the third image;
wherein $S_{\gamma,\rho}$ represents a coil sensitivity matrix of an aliased point corresponding to the image point in the third image, wherein the coil sensitivity matrix has $\gamma$ rows and $\rho$ columns, wherein $\gamma$ represents a number of channels, and $\rho$ represents an aliased factor;
wherein I represents a vector of image points in the third image corresponding to the aliased point, wherein a dimension of the vector of the image points in the third image corresponding to the aliased point equals the aliased factor;
wherein a represents a vector of the aliased point in an aliased image generated by performing Fourier transform on the first k-space data, wherein the dimension of the vector of the aliased point in the aliased image equals the number of channels $\gamma$;
wherein $t^*$ represents a value of an image point in the second image corresponding to the image point in the third image; and
wherein each of $\alpha$ and $\lambda_2$ represents a respective non-negative parameter.

15. The device according to claim 14, the processor is further caused to perform:
determining the aliased point corresponding to the to-be-determined image point in the third image based on an acceleration factor of the undersampling of the magnetic resonance signal and a location of the to-be-determined image point in the third image.

16. The device according to claim 11, wherein the operations further comprise:
determining whether a condition for stopping iterations is fulfilled, and
in response to a determination that the condition for stopping the iterations is not fulfilled,
taking the third image as a new first image,
performing enhancement processing on the new first image to obtain a new second image, and
performing constrained reconstruction on the first k-space data by using the new second image as a prior image to obtain a new third image;
wherein the condition for stopping the iterations comprises at least one of:
iteration number reaching a preset iteration number threshold, or
a quality of the new third image reaching a preset requirement.

17. The device according to claim 11, wherein moduli of the image supporting points in the second image are larger than values of background noises in the second image.

18. The device according to claim 11, wherein performing parallel imaging reconstruction on the first k-space data to obtain the first image comprises:
performing parallel imaging reconstruction on the first k-space data using GRAPPA method to obtain the first image.

19. The device according to claim 11, wherein performing enhancement processing on the first image comprises:
performing enhancement processing on the first image by using a total variation model.

20. The device according to claim 19, wherein performing enhancement processing on the first image by using the total variation model comprises:
determining a value of each image point in the second image according to a formula; and
filling an image domain with the values of the image points in the second image to generate the second image,
wherein the formula is as follows:

$$t^* = \underset{t}{\mathrm{argmin}}(\|t - u^*\|^2 + \lambda_1\|\nabla t\|_1),$$

wherein t* represents a to-be-determined value of an image point in the second image;
wherein t represents a to-be-determined variable;
wherein $\nabla$t represents a partial derivative of the to-be-determined variable;
wherein u* represents a value of an image point in the first image corresponding to the image point in the second image; and
wherein $\lambda_1$ represents a non-negative parameter.

* * * * *